United States Patent [19]
Bhatnagar et al.

[11] Patent Number: 5,917,204
[45] Date of Patent: Jun. 29, 1999

[54] INSULATED GATE BIPOLAR TRANSISTOR WITH REDUCED ELECTRIC FIELDS

[75] Inventors: Mohit Bhatnagar, Chandler; Charles E. Weitzel, Mesa, both of Ariz.

[73] Assignee: Motorola, Inc., Schaumburg, Ill.

[21] Appl. No.: 08/829,035

[22] Filed: Mar. 31, 1997

[51] Int. Cl.[6] .................................................. H01L 29/74
[52] U.S. Cl. ...................... 257/142; 257/146; 257/197; 257/212
[58] Field of Search .................................... 257/146, 212, 257/197, 378, 110, 133, 142

[56] References Cited

U.S. PATENT DOCUMENTS

5,703,385  12/1997  Zambrano ............................. 257/146

Primary Examiner—Carl Whitehead, Jr.
Attorney, Agent, or Firm—Robert F. Hightower; Eugene A. Parsons

[57] ABSTRACT

AN IGBT including a collector positioned on one surface of a substrate and a doped structure having a buried region therein positioned on the other surface of the substrate. The buried region defining a drift region in the doped structure extending vertically from the substrate and further defining a doped region in communication with the drift region and adjacent the surface of the doped structure. An emitter positioned on the doped structure in communication with the doped region. An insulating layer positioned on the doped structure with a metal gate positioned on the insulating layer so as to define a conduction channel extending laterally adjacent the control terminal and communicating with the drift region and the emitter. The substrate and buried region are the same conductivity and opposite the doped region to form a bipolar transistor therebetween.

11 Claims, 4 Drawing Sheets

INSULATED GATE BIPOLAR TRANSISTOR WITH REDUCED ELECTRIC FIELDS

FIELD OF THE INVENTION

The present invention pertains to insulated gate bipolar transistors and the fabrication thereof, and more specifically to silicon carbide insulated gate bipolar transistors.

BACKGROUND OF THE INVENTION

Conventionally, for power device related applications (60–2000 V), silicon based power MOSFETs or IGBTs are used. In addition to high-voltage and high-current capability, these devices should also have low on-state power losses and good switching characteristics (e.g. fast switching with minimal switching losses etc.). However, at present neither of these Si devices offers an ideal combination of the aforementioned specifications. Specifically, a Si MOSFET has very good switching characteristics but for high-voltage applications, its on-resistance becomes very high. This limits its usage of Si MOSFETs only for applications that require devices with a breakdown voltage ($V_B$) of less than 600–900 V. On the other hand, even for devices with high $V_B$ (600–2000 V), Si IGBTs have very good on-state characteristics (low forward voltage drop at high current-density). However, Si IGBTs can be used only for low-frequency applications (<40 KHz) because at high switching frequencies the switching losses for IGBTs become too high for practical applications. Thus, in the present day Si technology there is no single device that can offer combined benefits of Si MOSFET (fast switching, MOS gate control etc.) and Si IGBT (low forward voltage drop for high $V_B$ applications).

Recently, for power device applications silicon carbide (SiC) has gained a lot of attention due to its large electric field strength, high thermal conductivity and reasonably high mobility. It is expected that SiC based MOSFETs and IGBTs would be able to offer significantly improved performance advantages over their Si counterparts. For example, unlike Si technology where MOSFETs cannot be used for application that require devices with $V_B$ greater than 900 V, SiC MOSFET are expected to be useful for up to 2500 V applications. However, for higher $V_B$ applications (2500–5000 V), the on-resistance of a SiC MOSFET becomes too high and SiC based bipolar devices start offering performance advantages. Notably, compared to Si IGBTs and thyristors, SiC IGBTs could be operated at much higher switching frequencies due to their lower carrier lifetime as well as smaller drift regions.

Over the last five years, many different power transistors based on SiC technology have been demonstrated. These devices include SiC based MOSFETs, IGBTs and thyristors. Some of these devices have exhibited highly encouraging results in terms of the low on-state losses, high switching speeds, and high operating temperature capability. However, none of these devices come anywhere close to realizing the full potential that an optimally designed SiC based power device is expected to offer. One reason for the below expected performance of the experimental devices demonstrated so far is that all of these devices are essentially minor variations on conventionally used Si power devices. The design of these earlier devices does not address performance issues (e.g. poor inversion layer mobility and poor high-temperature reliability of gate oxide) that are specific to SiC technology.

For example, double diffusion MOSFET (DMOSFETs) is one of the most commonly used power MOSFET structure in Si technology but in its present form it cannot be used in SiC technology. In a DMOSFET gate-control occurs through an inversion channel that is formed in p-conductivity material along the lateral surface. However, due to the lack of manufacturable diffusion technology for silicon carbide, DMOSFETs cannot be fabricated in SiC. Also, the inversion channel in the DMOSFET is provided by forming gate oxide on p-conductivity material between the source and gate and for SiC this results in a poor quality of oxide with high fixed charges and a large number of traps at the oxide/SiC interface. This results in a reduction of the mobility of the carriers (electrons) that produce the current in the device and this reduction in the mobility of the electrons severely degrades the ON-resistance of the device.

An alternative, vertical structure for silicon carbide is a UMOSFET disclosed in U.S. Pat. No. 5,233,215, entitled "Silicon Carbide Power MOSFET with Floating Field Ring and Floating Field Plate" and issued Aug. 3, 1993. In the UMOSFET an inversion channel is formed by an MOS gate along an etched trench. Similar to DMOSFET, in the UMOSFET, the gate oxide is again formed on a p-conductivity layer, which produces a poor quality oxide and high ON-resistance for SiC based FETs.

Another major problem with SiC MOSFETs or IGBTs based on DMOS or UMOS technology is that due to the large breakdown field strength of SiC, in these devices the electric field in the gate oxide is very high. Experimental studies suggest that due to the high-temperature oxide reliability concerns in SiC MOS devices, the electric field in the oxide should be contained below 4 MV/cm. However, this would require limiting the electric field in SiC drift region to be much below the inherent breakdown field strength of the material. This suggests that for the case of SiC IGBTs devices based on DMOS or UMOS technology, the device performance (breakdown voltage, on-resistance etc.) will be determined by the gate oxide reliability concerns and not due to the intrinsic properties of SiC.

Accordingly, it would be highly advantageous to have a manufacturable IGBT with low ON-resistance, good switching characteristics (e.g. fast switching times and minimal switching losses etc.), low leakage currents, high channel density, etc.

It is a purpose of the present invention to provide a new and improved IGBT.

It is another purpose of the present invention to provide a new and improved IGBT with low ON-resistance, good switching characteristics, low leakage current, and high channel density.

It is yet another purpose of the present invention to provide a new IGBT structure that minimizes the electric field in the gate oxide and thus, alleviates the concerns of the gate-oxide reliability at high-temperature and high electric field.

It is a further purpose of the present invention to provide a new and improved IGBT which can be fabricated in silicon or silicon carbide or any III–V material system.

SUMMARY OF THE INVENTION

The above problems and others are at least partially solved and the above purposes and others are realized in an insulated gate bipolar transistor including a semiconductor substrate with a first conductivity type having a first surface and an opposite surface with a first current terminal positioned on the opposite surface. A doped structure with a second conductivity type is formed having a buried region with the first conductivity type positioned therein. The doped structure is positioned on the first surface of the substrate and defines a surface parallel with and spaced from the first surface of the substrate. The buried region is positioned in the doped structure so as to define a drift region in the doped structure extending from and generally perpendicular to the first surface of the substrate. The buried region is further positioned in the doped structure so as to define a doped region in communication with the drift region and adjacent the surface of the doped structure. Also, the buried region, the substrate, and a portion of the doped structure positioned therebetween form a bipolar transistor. A second current terminal includes a first implant region in the doped structure and in communication with the doped region and an electrical contact in communication with the first implant region and positioned on the surface of the doped structure. An insulating layer is positioned on the surface of the doped structure overlying the doped region and a control terminal is positioned on the insulating layer so as to define a conduction channel in the doped region. The conduction channel extends laterally adjacent to the control terminal and in communication with the drift region and the second current terminal.

The buried region can be formed utilizing several different techniques, including implanting particles in an epitaxial layer, or forming a first epitaxial layer on the substrate, forming a second epitaxial layer on the first epitaxial layer and defining the buried layer in the second epitaxial layer, and forming a third epitaxial layer on the second epitaxial layer, the third epitaxial layer defining the conduction channel.

In one specific embodiment the second current terminal includes a second implant region of the first conductivity type in communication with the first implant region and with the first implant region positioned between the second implant region and the drift region so as to form the conduction channel into an accumulation channel. In another specific embodiment the second implant region includes a second implant region of the first conductivity type in communication with the first implant region and positioned between the first implant region and the drift region as to form the conduction channel into an inversion channel.

BRIEF DESCRIPTION OF THE DRAWINGS

Referring to the drawings.

DESCRIPTION OF THE PREFERRED EMBODIMENTS

Figure 1:
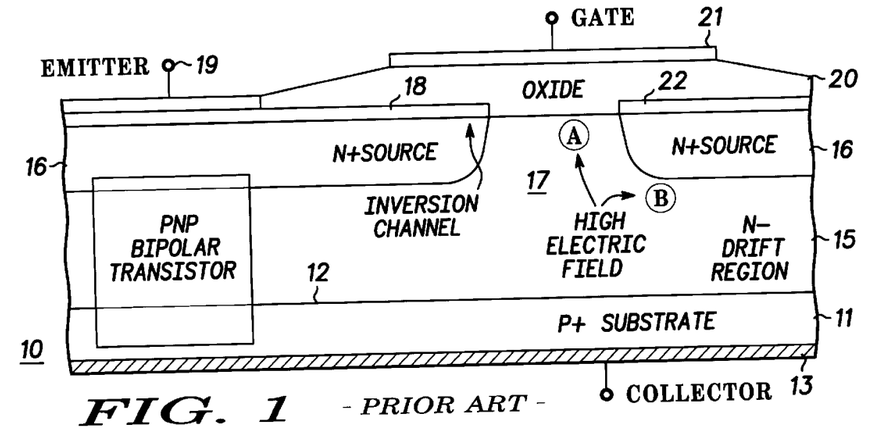
FIG. 1 is a simplified sectional view of a conventional insulated gate bipolar transistor.

Referring specifically to FIG. 1, a simplified sectional view is illustrated of a conventional DMOS insulated gate bipolar transistor 10. Transistor 10 includes a P+ doped semiconductor substrate 11 formed of silicon. A layer of metal is deposited on a lower or rear surface of substrate 11 and processed to form an ohmic contact by techniques well known by those skilled in the art, which is a collector 13 for transistor 10. An N doped structure 15 is positioned on surface 12 of substrate 11 and a diffused region 16 is formed in doped structure 15 so as to define a vertical drift region 17. An N+ source 18 is diffused into diffused region 16 and a metal emitter terminal 19 is positioned on the surface in communication with diffused region 16 and source 18.

An insulating layer 20 is positioned on the surface of doped structure 15 in overlying relationship to a portion of source 18 and diffused region 16. Also, insulating layer 20 overlies drift region 17 within (between) diffused region 16. A metal gate 21 is deposited on layer 20 and processed in a well known manner to produce a contact which operates as an MOS gate. Metal layer 21 defines an inversion channel 22 in diffused region 16 beneath insulating layer 20 and extending between source 18 and drift region 17. When properly energized by potentials applied between collector 13, emitter 19 and gate 21 in a well known fashion, transistor 10 conducts current from emitter 19, source 18, inversion channel 22, drift region 17, and substrate 11 to collector 13.

The particular structure of DMOS insulated gate bipolar transistor 10 is not suitable for silicon carbide (SiC) technology because, due to the very small diffusion coefficient of N and P type dopants in SiC for temperatures below 1800° C., DMOS technology is not manufacturable in SiC. An alternative way to fabricate transistor 10 is by using ion-implantation instead of diffusion for creating N+ source and P– base regions. In this case, however, as indicated in FIG. 1 by A and B, respectively, high electric fields are present at the interface between insulating layer 20 and doped structure 15 (oxide/semiconductor interface) as well as at the interface between diffused region 16 and drift region 17 (corner of the P-base/N-drift region interface). For the case of DMOS insulated gate bipolar transistors in a silicon material system, the maximum field at point B could only be as high as the breakdown field strength of silicon (approximately 0.2 MV/cm) and thus, the field at point A is always much below the maximum allowable field in the gate oxide (approximately 10 MV/cm). However, for the case of silicon carbide based DMOS insulated gate bipolar transistors, the maximum field at point B could be as high as the breakdown field strength of silicon carbide (approximately 3 MV/cm) and thus, the field at in the gate oxide at point A could be as high as 5–7 MV/cm. For such high values of electric field in the gate, the reliability of oxide under high electric fields is extremely poor for silicon carbide (SiC) and, thus, premature oxide failure would occur in a SiC insulated gate bipolar transistor at point A.

Figure 2:
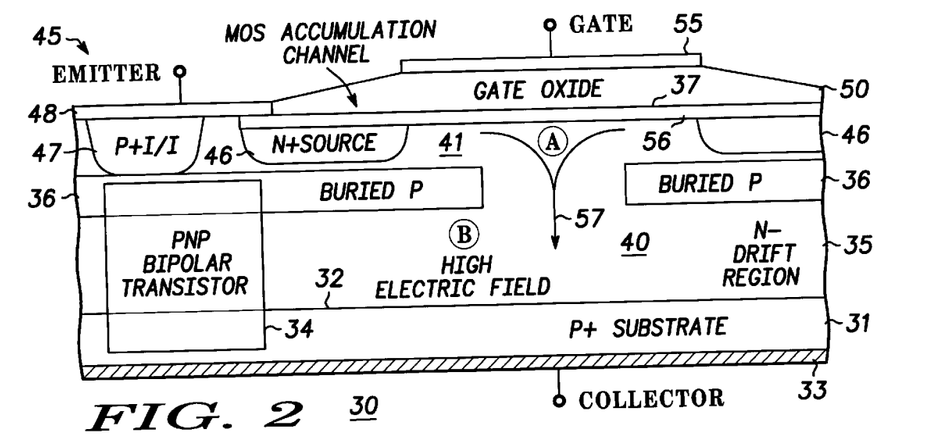
FIG. 2 is a simplified sectional view of one embodiment of an insulated gate bipolar transistor in accordance with the present invention.

Referring specifically to FIG. 2, a simplified sectional view is illustrated of an insulated gate bipolar transistor 30 in accordance with the present invention. Transistor 30 includes a semiconductor substrate 31 with an upper surface 32, which may be any convenient semiconductor material, such as silicon, silicon carbide, gallium arsenide, gallium nitride, etc., doped for a first type of conductivity. In this preferred embodiment, substrate 31 is formed of silicon carbide and is heavily doped (P+) for P-conductivity. A layer 33 of metal is deposited on a lower or rear surface of substrate 31 and processed to form an ohmic contact by techniques well known by those skilled in the art. In this embodiment, layer 33 is a collector terminal for transistor 30. It will be understood that layer 33 can be deposited at any convenient time throughout the fabrication process and the description is included at this time for simplicity of understanding.

A doped structure 35, having a buried region 36 positioned therein, is positioned on surface 32 of substrate 31 and defines a surface 37 parallel with and spaced from surface 32 of the substrate. Buried region 36 is positioned in doped structure 35 so as to define a drift region 40 in doped structure 35 extending from and generally perpendicular to surface 32 of the substrate 31. The thickness and the doping of drift region 40 are designed to support a given breakdown voltage using basic device physics. Further, buried region 36 is positioned in doped structure 35 so as to define a doped region 41 in communication with drift region 40 and adjacent surface 37 of doped structure 35. While buried region 36 appears in FIG. 2 as two spaced apart portions, it will be understood by those skilled in the art that transistor 30 is normally constructed with a closed formation, i.e. buried region 36 may appear circular, race-track shaped, serpentine, etc in a top plan, all such formations being well known in the art.

Buried region 36 is formed with a conductivity type similar to substrate 31 and doped structure 35 has an opposite conductivity type. In this specific embodiment, substrate 31 has a P type conductivity and, therefore, buried region 36 has a P type conductivity and doped structure 35 has an N type conductivity. Thus, substrate 31, doped structure 35 and buried region 36 form a P-N-P bipolar transistor 34.

A second current terminal 45 is positioned on doped structure 35 in communication with doped region 41. Second current terminal 45, which in this embodiment is an emitter terminal of transistor 30, includes an implant area 46 adjacent to surface 37 which is heavily doped ($N^+$) with the second conductivity type. Second current terminal 45 is electrically coupled to buried region 36 as, for example, by means of an implant area 47 that extends between buried region 36 and surface 37 of doped structure 35 and is spaced from implant area 46. A metal layer 48 is deposited on surface 37 in electrical contact with implant area 46 and implant area 47 and is processed in a well known manner to provide an ohmic contact between metal layer 48 and implant areas 46 and 47.

An insulating layer 50 is positioned on surface 37 of doped structure 35 in overlying relationship to doped region 41. Generally, insulating layer 50 overlies surface 37 within (between) implant area or areas 46. In a preferred embodiment insulating layer 50 is an oxide or nitride grown on surface 37. Because doped region 41 is an n-conductivity material, the quality of the oxide grown thereon is relatively good and there are no problems with the interface or with fixed charges in the material thereunder. A metal layer 55 is deposited on layer 50 and processed in a well known manner to produce a contact which operates as a gate terminal. The MOS gate is preferable (over a Schottky gate) for controlling current in the channel region because of lower conduction channel resistance in power devices. Also, the MOS gate offers lower gate leakage current over, for example, Schottky gates. Metal layer 55 defines an accumulation channel 56 in doped region 41 adjacent surface 37. Accumulation channel 56 extends laterally adjacent the gate terminal between drift region 40 and implant area 46. When properly energized by potentials applied between the emitter, collector and gate terminals in a well known fashion, IGBT transistor 30 conducts current from implants 46 of emitter 45, through accumulation channel 56, drift region 40, and substrate 31 to collector terminal 33, as represented by arrows 57.

The operation of accumulation channel IGBT 30 is quite similar to DMOS IGBT 10 of FIG. 1 except that MOS gate control occurs through accumulation channel 56. IGBT 30 has a lower $R_{ON}$ than inversion channel MOSFET devices since accumulation channel mobility is 2–3 times higher than inversion channel mobility. The presence of P buried region 36 provides complete isolation of gate insulating layer 50 in drift region 40, designated by A, from the high electric field region, designated B. In IGBT 30, unlike a DIMOS or UMOS structure, gate oxide (insulating layer 50) reliability problem under high electric fields and high temperatures is completely eliminated. Further, $V_B$ of IGBT 30 is determined exclusively by the doping and thickness of drift region 40 and thus, allows optimal use of the inherently superior properties of a drift region formed of SiC. This is in contrast to prior art DMOS or DIMOS IGBTs where reliability of the oxide under the gate determines the maximum allowable field in SiC and thus, limits the $V_B$ of the SiC device below the expected $V_B$ of the drift region. Depending on the total charge in the N type channel region, accumulation channel IGBT 30 can be designed for either a normally-ON ($V_T<0$) or a normally-OFF ($V_T>0$) mode.

Figure 3:
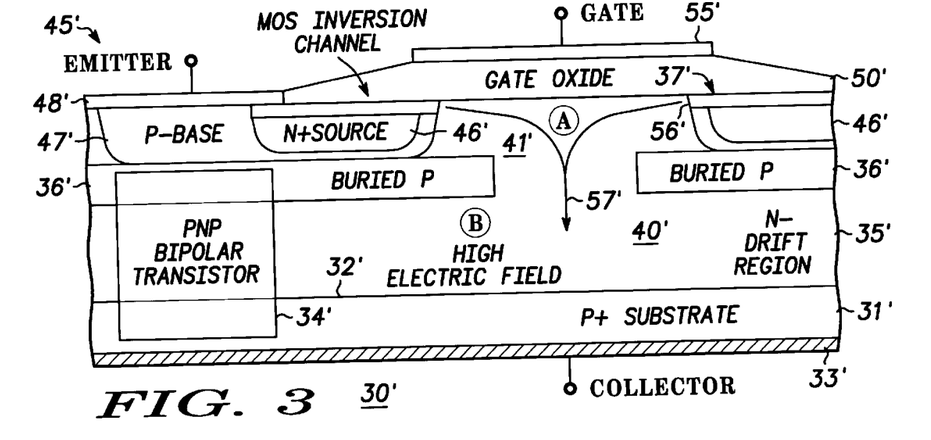
FIG. 3 is a simplified sectional view of another embodiment of an insulated gate bipolar transistor in accordance with the present invention.

Referring specifically to FIG. 3, a simplified sectional view is illustrated of another embodiment of an insulated gate bipolar transistor 30' in accordance with the present invention. Components of the embodiment illustrated in FIG. 3 which are similar to components described in conjunction with FIG. 2 are similarly numbered and a prime is added to all numbers to indicate the different embodiment. Transistor 30' includes a semiconductor substrate 31' with an upper surface 32' and a layer 33' of metal deposited on a lower or rear surface as a collector terminal for transistor 30'. A doped structure 35', having a buried region 36' positioned therein, is positioned on surface 32' of substrate 31' and defines a surface 37' parallel with and spaced from surface 32'. Buried region 36' is positioned in doped structure 35' so as to define a drift region 40' and a doped region 41' in communication with drift region 40' and adjacent surface 37' of doped structure 35'. In general, substrates 31 and 31', doped structures 35 and 35' and buried regions 36 and 36' are constructed similarly and in a manner to be described presently. Also, as previously described, substrate 31', doped structure 35' and buried region 36' form a P-N-P bipolar transistor 34'.

A second current terminal 45' is positioned on doped structure 35' in communication with doped region 41'. Second current terminal 45', which in this embodiment is an emitter terminal of transistor 30', includes an implant area 46' adjacent surface 37' which is heavily doped ($N^+$) with the first conductivity type. In this embodiment, second current terminal 45' is electrically coupled to buried region 36' by means of an implant area 47' that extends between buried region 36' and surface 37' of doped structure 35 and is positioned at least partially between implant area 46' and drift region 40'. A metal layer 48' is deposited on surface 37' in electrical contact with implant area 46' and implant area 47' and is processed in a well known manner to provide an ohmic contact between metal layer 48' and implant areas 46' and 47'.

An insulating layer 50' is positioned on surface 37' of doped structure 35' in overlying relationship to doped region 41'. Generally, insulating layer 50' overlies surface 37' within (between) implant area or areas 46'. In a preferred embodiment insulating layer 50' is an oxide or nitride grown on surface 37'. A metal layer 55' is deposited on layer 50' and processed in a well known manner to produce a contact which operates as a gate terminal. Metal layer 55' defines an inversion channel 56' in implant area 47' adjacent surface 37'. Inversion channel 56' extends laterally adjacent the gate terminal between drift region 40' and implant area 46'. When properly energized by potentials applied between the emitter, collector and gate terminals in a well known fashion, IGBT transistor 30' conducts current from implants 46' of emitter 48', through inversion channel 56', drift region 40', and substrate 31' to collector terminal 33', as represented by arrows 57'.

The operation of inversion channel IGBT 30' is quite similar to DMOS IGBT 10 of FIG. 1 except that MOS gate control occurs through inversion channel 56'. The presence of P buried region 36' provides complete isolation of gate insulating layer 50' in drift region 40', designated by A, from the high electric field region, designated B. In IGBT 30', unlike a DIMOS or UMOS structure, gate oxide (insulating layer 50') reliability problem under high electric fields and high temperatures is completely eliminated. Further, $V_B$ of IGBT 30' is determined exclusively by the doping and thickness of drift region 40' and thus, allows optimal use of the inherently superior properties of a drift region formed of SiC. This is in contrast to prior art DMOS or DIMOS IGBTs where reliability of the oxide under the gate determines the maximum allowable field in SiC and thus, limits the $V_B$ of the SiC device below the expected $V_B$ of the drift region. Inversion channel IGBT 30' is generally designed to have threshold voltage ($V_T$) greater than zero V and the $V_T$ primarily depends on the doping of the P-base region, the thickness of insulating layer 50', and the work function of gate metal layer 55' among other factors. Inversion layer IGBT 30' allows fabrication of SiC IGBTs with gate control specifications very similar to that of Si bipolar power devices.

Figure 4:
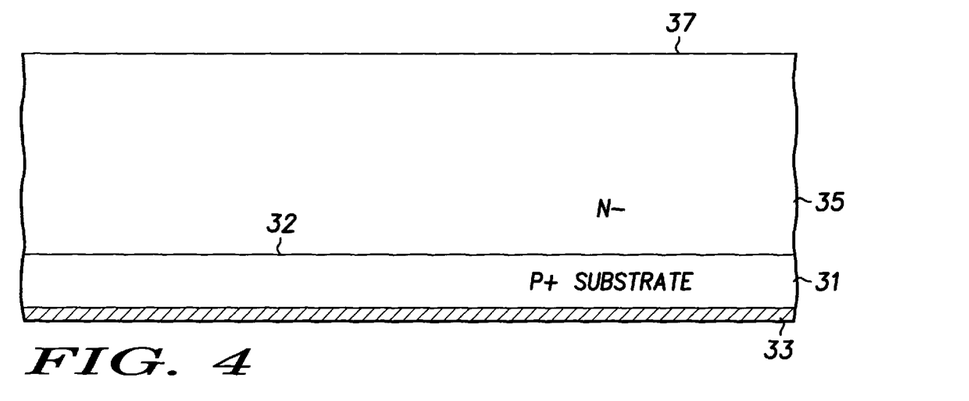
FIGS. 4–6 illustrate several steps in a method of fabricating the insulated gate bipolar transistor of FIGS. 2 or 3.
Figure 5:
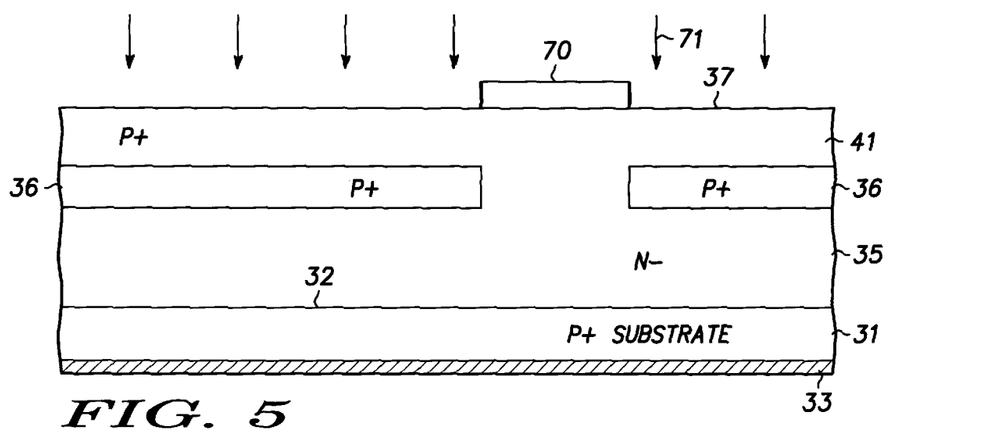
Figure 6:
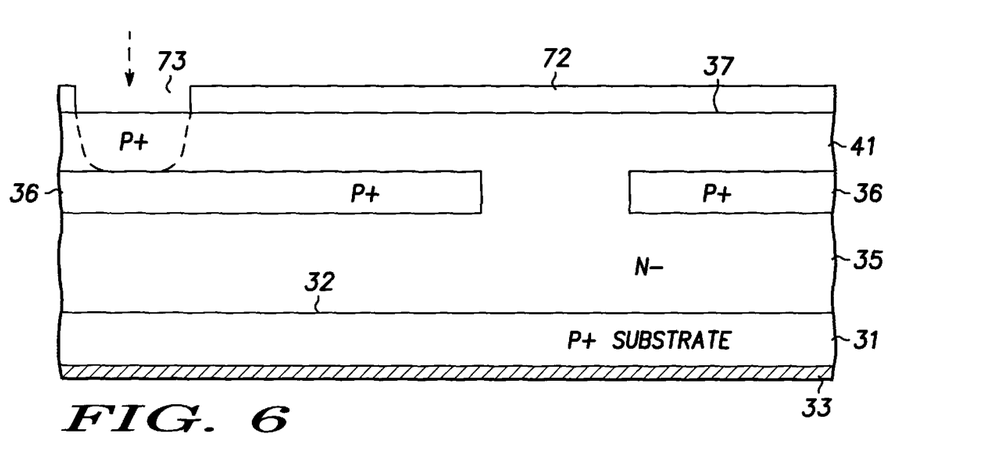

Turning now to FIGS. 4–6, several steps in one process for fabricating buried layer 36 or 36' in transistors 30 or 30' are illustrated. Components which are similar to components of transistors 30 or 30' in FIGS. 2 and 3 are designated with the same numbers (primes omitted for simplicity) to aid in comparing the devices. Referring specifically to FIG. 4, a semiconductor substrate 31, in this example a silicon carbide substrate, having an upper surface 32 is provided and a current contact 33 is formed on the lower surface. Substrate 31 is heavily doped for P-conductivity. A relatively thick epitaxial layer 35 lightly doped for N-conductivity is epitaxially grown on surface 32 utilizing any of the well known processes. Epitaxial layer 35 represents doped structure 35 described in conjunction with FIGS. 2 and 3 and defines an upper surface 37.

Turning to FIG. 5, an implant mask 70 is formed on surface 37 of epitaxial layer 35 in any well known manner. For example, a combination of metal layers and photoresist are deposited on surface 37 and patterned by exposing the photoresist and then using it to etch the metal. The patterned metal and remaining photoresist, if convenient, is then used as a mask to deeply implant particles into epitaxial layer 35, whereby buried layer 36 is formed. Buried layer 36 has a P+-conductivity and any material which will provide this conductivity and is capable of being deeply implanted can be used.

In a specific example, the upper surface of buried layer 36 is in the range of approximately 0.2 μm to 0.3 μm below surface 37 and the lower surface is in the range of approximately 0.7 μm to 1.1 μm below surface 37. Also, the lower surface of buried layer 36 is in the range of 5 μm to 35 μm from surface 32 of substrate 31. In this example the particles forming buried layer 36 are implanted (represented by arrows 71) with a density of 5E15 to 5E16 at an energy in the range of 200 KeV to 1 MeV to achieve the desired depth. With buried layer 36 properly formed, implant mask 70 is removed.

Turning to FIG. 6, a new implant mask 72 is formed by deposition and patterning similar to that described above. In this step implant mask 72 covers the entire surface 37, except for an area 73 directly above buried layer 36. Particles are implanted through area 73 into doped region 41, defined by buried region 36, to form heavily doped P-conductivity implant area 47 extending from buried region 36 to surface 37 of epitaxial layer 35. The length, or lateral dimension of implant area 47 depends upon the selected position of implant area 47 and whether the embodiment of FIG. 2 or FIG. 3 is being fabricated. The particles are implanted from a depth in the range of approximately 0.2 μm to 0.3 μm with a density in the range of 5E15 to 5E16 and an energy in the range of 50 KeV to 300 KeV. As explained above, implant area 47 is provided to form an electrical connection between buried region 36 and emitter terminal 45, as well as to define inversion channel 56' in the embodiment of FIG. 3.

Figure 7:
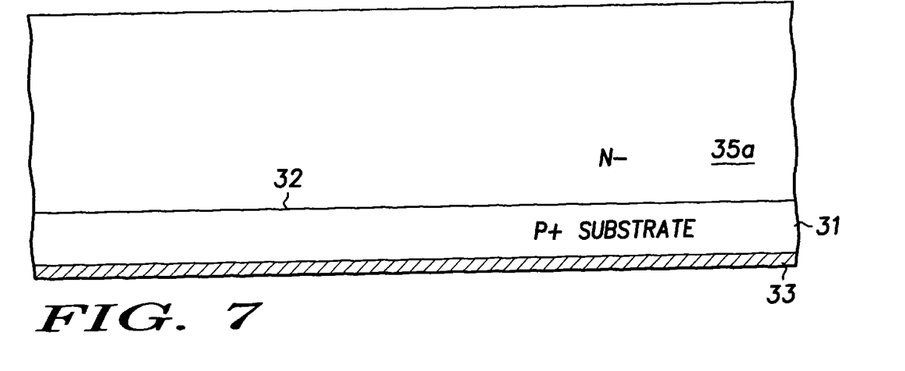
FIGS. 7–9 illustrate several steps in another method of fabricating the insulated gate bipolar transistor of FIGS. 2 or 3.
Figure 8:
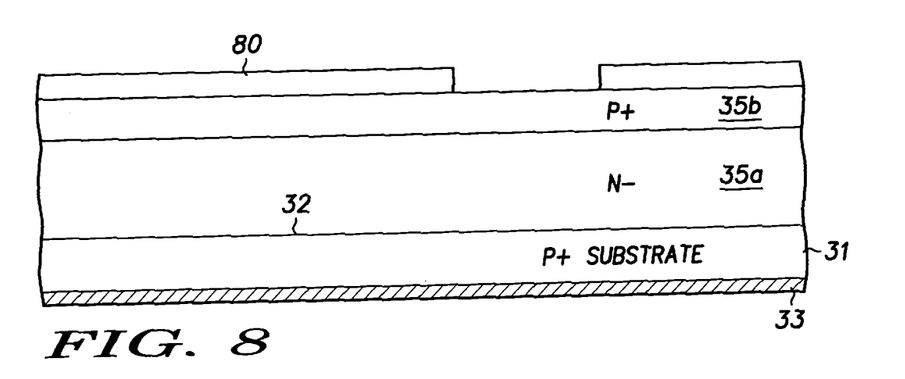
Figure 9:
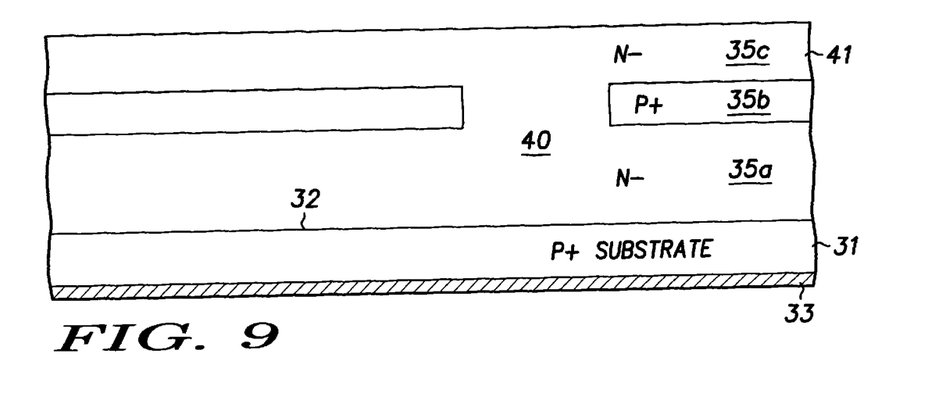

Turning now to FIGS. 7–9, several steps in another process for fabricating buried layers 36 or 36' in transistors 30 or 30' is illustrated. Components which are similar to components of transistors 30 or 30' in FIGS. 1 and 2 are designated with the same numbers (primes omitted for simplicity) to aid in comparing the devices. Referring specifically to FIG. 7, a semiconductor substrate 31 having an upper surface 32 is provided and a current contact 33 is formed on the lower surface. Substrate 31 is heavily doped for P-conductivity. A first epitaxial layer 35a lightly doped for N-conductivity is epitaxially grown on surface 32 utilizing any of the well known processes. Epitaxial layer 35a represents a first portion of doped structure 35 described in conjunction with FIGS. 2 or 3.

Turning to FIG. 8, a second epitaxial layer 35b heavily doped for P+-conductivity is grown on first epitaxial layer 35a utilizing any of the well known processes. An etch mask 80 is formed on the upper surface of epitaxial layer 35b in any well known technique, such as photoresist or metal and patterning. Etch mask 80 is then used to etch an opening through epitaxial layer 35b, which opening will ultimately define drift region 40. A third epitaxial layer 35c is then epitaxially grown over layer 35b, including the opening therethrough. Because epitaxial layer 35b is relatively thin (0.4 μm to 0.9 μm), the nonuniformity which would be produced by the opening (drift region 40) in epitaxial layer 35b can be compensated for relatively simply, if necessary, with an additional mask and growth stage in the opening after which the mask is removed and the complete layer 35c is grown, as illustrated in FIG. 9. Implant areas 46 and 47 are then completed as explained above.

Figure 10:
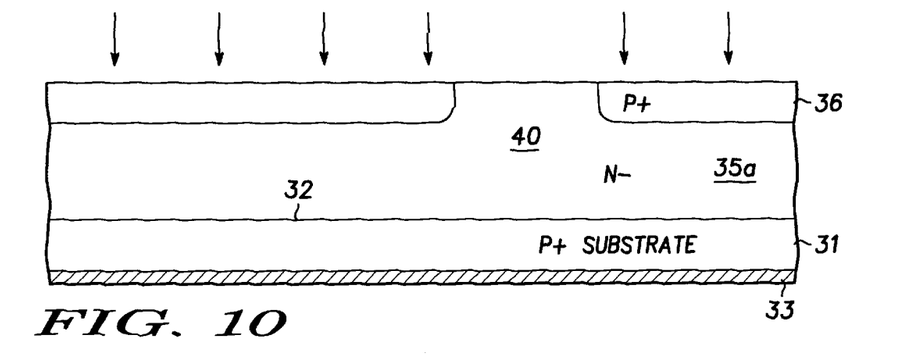
FIGS. 10–11 illustrate several steps in another method of fabricating the insulated gate bipolar transistor of FIGS. 2 or 3.
Figure 11:
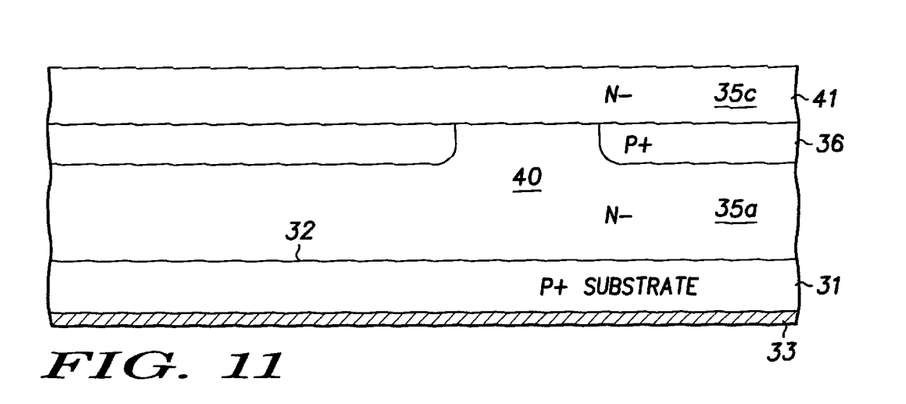

Turning now to FIGS. 10–11, several steps in yet another process for fabricating buried layers 36 or 36' in transistors 30 or 30' is illustrated. Components which are similar to components of transistors 30 and 30' in FIGS. 2 and 3 are designated with the same numbers (primes omitted for simplicity) to aid in comparing the devices and methods. In this embodiment it is again assumed that the structure of FIG. 7 is the starting point. After growing epitaxial layer 35a (FIG. 7), buried layer 36 is formed by ion-implantation into epitaxial layer 35a, patterning the ion implant to define drift region 40 therethrough. The ion-implantation can be performed using any of the standard techniques known in the art, generally including an implant mask (not shown). Channel layer 35c is then grown on top of implanted buried layer 36 and drift region 40, as illustrated in FIG. 11.

Accordingly, a new and improved IGBT is disclosed including a vertical drift region, MOS gate control, a lateral gate or channel region, and either an accumulation or an inversion channel. Further, the improved IGBT can easily be fabricated in any of a silicon, silicon carbide, gallium arsenide, gallium nitride, or other III–V material systems. Generally, a SiC material system is preferred because of the lower ON-resistance, especially for high power applications. In comparison to a SiC DIMOS or UMOS devices, the present approach solves the problem of poor reliability of MOS oxide (or other gate insulating layers) under high electric field conditions. Furthermore, unlike a current-controlled device (e.g. GTO), the disclosed devices do not require any complex gate drive circuitry and snubbers for gate control. Compared to MOS gated thyristors (e.g. MCT, MTO). for 2–5 KV applications, an advantage of the present IGBTs lies in a better $R_{ON}$ vs. switching speed trade-off.

The present SiC power transistors offer significantly improved performance over alternative SiC approaches for applications that require devices with high $V_B$ (2–5 KV), high current (10–100s Amps) and fast switching speed (>200 KHz). The vertical drift region provides higher channel density and a substantial savings in semiconductor substrate real estate. The MOS gate control provides higher transconductance and reduced gate leakage current. The lateral gate or channel region provides improved oxide and an improved epitaxial layer to oxide (SiC/SiO2) interface. Thus, a new and improved IGBT with low ON-resistance, good switching characteristics, low leakage current, and high channel density is disclosed.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. An insulated gate bipolar transistor comprising:

a semiconductor substrate with a first conductivity type having a first surface and an opposite surface with a first current terminal positioned on the opposite surface;

a doped structure with a second conductivity type having a buried region with the first conductivity type positioned therein, the doped structure being positioned on the first surface of the substrate and defining a surface parallel with and spaced from the first surface of the substrate, the buried region being positioned in the doped structure so as to define a drift region in the doped structure extending from and generally perpendicular to the first surface of the substrate, the buried region being further positioned in the doped structure so as to define a doped region in communication with the drift region and adjacent the surface of the doped structure;

the substrate and the buried region having a portion of the doped structure positioned therebetween so as to define a bipolar transistor;

a second current terminal including a first implant region of the second conductivity type in the doped structure in communication with the doped region wherein the first implant region contacts the doped structure, and an electrical contact positioned on the doped structure in communication with the first implant region and the buried region;

an insulating layer positioned on the surface of the doped structure overlying the doped region; and a control terminal positioned on the insulating layer so as to define a conduction channel in the doped region, the conduction channel extending laterally adjacent the control terminal and communicating with the drift region and the first implant region.

2. An insulated gate bipolar transistor as claimed in claim 1 wherein the insulating layer is one of an oxide and a nitride.

3. An insulated gate bipolar transistor as claimed in claim 1 wherein the control terminal includes a layer of metal positioned on the oxide to form a metal-oxide-semiconductor gate.

4. An insulated gate bipolar transistor as claimed in claim 1 wherein the substrate includes one of silicon, silicon carbide, gallium arsenide, gallium nitride, or III–V materials.

5. An insulated gate bipolar transistor as claimed in claim 1 wherein the second current terminal includes a second implant region of the first conductivity type in communication with the first implant region and with the first implant region positioned between the second implant region and the drift region so as to form the conduction channel into an accumulation channel.

6. An insulated gate bipolar transistor as claimed in claim 1 wherein the doped structure includes an epitaxial layer grown on the substrate.

7. An insulated gate bipolar transistor as claimed in claim 6 wherein the buried region includes an implant in the doped structure.

8. An insulated gate bipolar transistor as claimed in claim 1 wherein the doped structure includes a first epitaxial layer with a second conductivity grown on the substrate, a second epitaxial layer with a first conductivity grown on the first epitaxial layer and defining the buried region, and a third epitaxial layer grown on the second epitaxial layer.

9. A silicon carbide insulated gate bipolar transistor comprising:

a semiconductor substrate with a first conductivity type having a first surface and an opposite surface with a first current terminal positioned on the opposite surface;

a doped epitaxial structure with a second conductivity type having a buried region of the first conductivity type positioned therein, the epitaxial structure being positioned on the first surface of the substrate and defining a surface parallel with and spaced from the first surface of the substrate, the buried region being positioned in the epitaxial structure so as to define a drift region in the epitaxial structure extending from and generally perpendicular to the first surface of the substrate, the buried region being further positioned in the epitaxial structure so as to define a laterally extending doped region in communication with the drift region and adjacent the surface of the epitaxial structure;

the substrate and the buried region having a portion of the epitaxial structure positioned therebetween so as to define a bipolar transistor;

a second current terminal including a first implant region of the second conductivity type in the epitaxial structure in communication with the doped region wherein the first implant region contacts the epitaxial structure, and an electrical contact positioned on the epitaxial structure in communication with the first implant region and the buried region;

a dielectric layer including one of an oxide and a nitride formed on the surface of the epitaxial structure overlying the doped region; and a metal layer forming a control terminal and positioned on the dielectric layer so as to define a conduction channel in the doped region, the conduction channel extending laterally adjacent the control terminal and communicating with the drift region and the second current terminal.

10. An insulated gate bipolar transistor as claimed in claim 9 wherein the second current terminal includes a second implant region of the first conductivity type in communication with the first implant region and with the first implant region positioned between the second implant region and the drift region so as to form the conduction channel into an accumulation channel.

11. An insulated gate bipolar transistor as claimed in claim 9 wherein the first conductivity type is p conductivity and the second conductivity type is n conductivity.

* * * * *